(12) United States Patent
Kardach et al.

(10) Patent No.: US 10,014,046 B2
(45) Date of Patent: *Jul. 3, 2018

(54) DEVICE, SYSTEM, AND METHOD OF MEMORY ALLOCATION

(71) Applicant: Intel Corporation, Santa Clara, CA (US)

(72) Inventors: Jim Kardach, Saratoga, CA (US); Nikos Kaburlasos, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 42 days.

This patent is subject to a terminal disclaimer.

(21) Appl. No.: 14/711,581

(22) Filed: May 13, 2015

(65) Prior Publication Data

US 2015/0357025 A1     Dec. 10, 2015

Related U.S. Application Data

(63) Continuation of application No. 14/142,427, filed on Dec. 27, 2013, now Pat. No. 9,058,894, which is a continuation of application No. 13/332,526, filed on Dec. 21, 2011, now Pat. No. 8,843,702, which is a continuation of application No. 11/967,296, filed on Dec. 31, 2007, now Pat. No. 8,095,725.

(51) Int. Cl.
*G11C 11/406* (2006.01)
*G11C 7/10* (2006.01)
*G06F 12/02* (2006.01)
*G06F 12/06* (2006.01)

(52) U.S. Cl.
CPC .... *G11C 11/40618* (2013.01); *G06F 12/0223* (2013.01); *G06F 12/06* (2013.01); *G06F 12/0607* (2013.01); *G11C 7/1072* (2013.01); *G11C 11/406* (2013.01); *G11C 11/40622* (2013.01); *G06F 2212/1028* (2013.01); *Y02B 60/1225* (2013.01)

(58) Field of Classification Search
None
See application file for complete search history.

(56) References Cited

U.S. PATENT DOCUMENTS

| | | | |
|---|---|---|---|
| 6,170,039 B1 | 1/2001 | Kishida | |
| 6,185,654 B1 | 2/2001 | Van Doren | |
| 6,366,515 B2 | 4/2002 | Hidaka | |
| 6,401,177 B1 | 6/2002 | Koike | |
| 8,095,725 B2 | 1/2012 | Kardach et al. | |
| 8,843,702 B2 * | 9/2014 | Kardach | G06F 12/0223 711/106 |
| 9,058,894 B2 * | 6/2015 | Kardach | G06F 12/0223 |

(Continued)

*Primary Examiner* — Denise Tran
(74) *Attorney, Agent, or Firm* — Compass IP Law PC

(57) ABSTRACT

Device, system, and method of memory allocation. For example, an apparatus includes: a Dual In-line Memory Module (DIMM) including a plurality of Dynamic Random Access Memory (DRAM) units to store data, wherein each DRAM unit includes a plurality of banks and each bank is divided into a plurality of sub-banks; and a memory management unit to allocate a set of interleaved sub-banks of said DIMM to a memory page of an Operating System, wherein a combined memory size of the set of interleaved sub-banks is equal to a size of the memory page of the Operating System.

20 Claims, 3 Drawing Sheets

(56) References Cited

U.S. PATENT DOCUMENTS

| | | |
|---|---|---|
| 2002/0191467 A1 | 12/2002 | Matsumoto et al. |
| 2003/0023825 A1* | 1/2003 | Woo ............... G06F 12/023 |
| | | 711/170 |
| 2004/0268031 A1* | 12/2004 | Lawrence ......... G11C 11/406 |
| | | 711/106 |
| 2005/0041506 A1 | 2/2005 | Hwang et al. |
| 2005/0068826 A1 | 3/2005 | Hoehler |
| 2005/0105357 A1 | 5/2005 | Oh |
| 2006/0181949 A1* | 8/2006 | Kini ............... G06F 1/3203 |
| | | 365/230.03 |
| 2008/0080288 A1 | 4/2008 | Park et al. |
| 2012/0089772 A1 | 4/2012 | Kardach et al. |

\* cited by examiner

DEVICE, SYSTEM, AND METHOD OF MEMORY ALLOCATION

CROSS REFERENCE TO RELATED APPLICATIONS

This application is a continuation of U.S. patent application Ser. No. 14/142,427, filed Dec. 27, 2013, now U.S. Pat. No. 9,058,894, which is a continuation of U.S. patent application Ser. No. 13/332,526, filed Dec. 21, 2011, now U.S. Pat. No. 8,843,702, which is a continuation of U.S. patent application Ser. No. 11/967,296, filed Dec. 31, 2007, now U.S. Pat. No. 8,095,725, the entirety of each of which is hereby incorporated by reference.

BACKGROUND

A computing system may include a memory unit to store data processed by a Central Processing Unit (CPU). The memory unit may include, for example, one or more Dual In-line Memory Module (DIMM) components. A DIMM may include one or more Integrated Circuits (ICs) of Random Access Memory (RAM), for example, multiple Dynamic RAM (DRAM) components.

When a software application is launched, an Operating System (OS) retrieves the data related to the application from a storage unit (e.g., a hard disk drive), and assigns to the application-related data logical memory pages, in accordance with the application size. Additionally, a Memory Management Unit (MMU) allocates physical memory areas of the DRAM components to store the application-related data; this allocation is performed based on logical memory pages assigned to the application by the OS.

Memory interleaving techniques may be used for accessing banks of a DRAM component, for example, to allow substantially simultaneous access to multiple bytes of data. Unfortunately, utilization of memory interleaving in conjunction with DRAM components may result in excessive power consumption.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
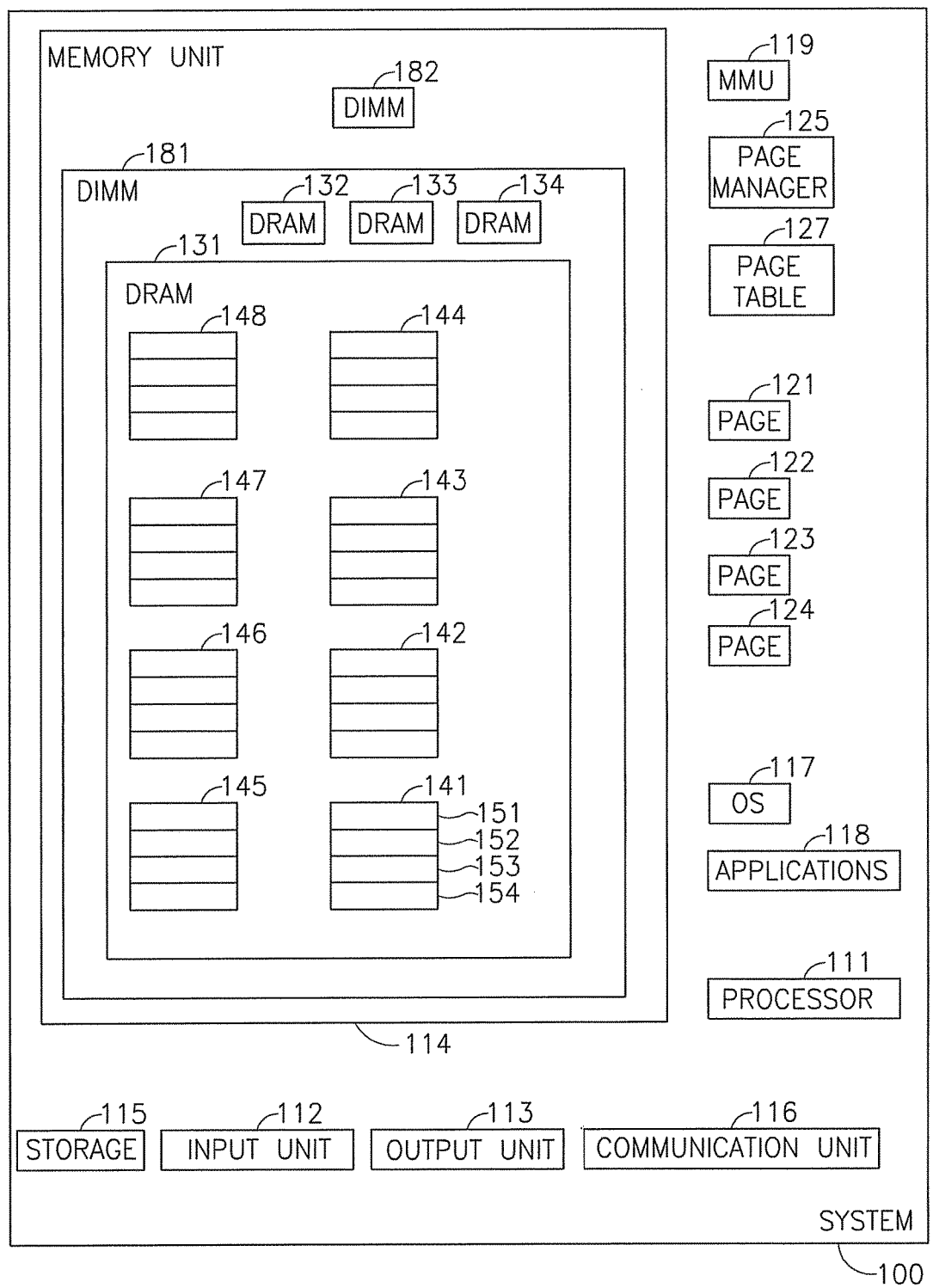
FIG. 1 is a schematic block diagram illustration of a system able to utilize memory allocation in accordance with a demonstrative embodiment of the invention.

In the following detailed description, numerous specific details are set forth in order to provide a thorough understanding of some embodiments of the invention. However, it will be understood by persons of ordinary skill in the art that embodiments of the invention may be practiced without these specific details. In other instances, well-known methods, procedures, components, units and/or circuits have not been described in detail so as not to obscure the discussion.

Discussions herein utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein includes, for example, "multiple" or "two or more". For example, "a plurality of items" includes two or more items.

The term "bank" as used herein includes, for example, a division of a DRAM; for example, a DRAM is divided into multiple sub-units, namely, banks. The division allows, for example, simultaneous access to multiple DRAM rows, thereby increasing the efficiency of the DRAM.

The term "size" as used herein includes, for example, a size of a logical memory area, or a size of a physical memory area, or a storage capacity corresponding to a memory area or a memory portion. The size may be measured, for example, in bits, bytes, kilobytes, megabytes, gigabytes, or other suitable units.

Some embodiments of the invention may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a non-mobile or non-portable device, a wireless communication station, a wireless communication device, a wireless Access Point (AP), a wired or wireless router, a wired or wireless modem, a wired or wireless network, a Local Area Network (LAN), a Wireless LAN (WLAN), a Metropolitan Area Network (MAN), a Wireless MAN (WMAN), a Wide Area Network (WAN), a Wireless WAN (WWAN), a Personal Area Network (PAN), a Wireless PAN (WPAN), devices and/or networks operating in accordance with existing IEEE 802.11, 802.11a, 802.11b, 802.11g, 802.11n, 802.16, 802.16d, 802.16e, 802.16m standards and/or future versions and/or derivatives and/or Long Term Evolution (LTE) of the above standards, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, a wired or wireless handheld device (e.g., BlackBerry, Palm Treo), a Wireless Application Protocol (WAP) device, or the like.

FIG. 1 schematically illustrates a block diagram of a system 100 able to utilize memory allocation in accordance with some demonstrative embodiments of the invention. System 100 may be or may include, for example, a computing device, a computer, a Personal Computer (PC), a server computer, a client/server system, a mobile computer, a portable computer, a laptop computer, a multi-display laptop computer, a multi-screen laptop computer, a notebook computer, a tablet computer, a network of multiple interconnected devices, or the like.

System 100 includes, for example, a processor 111, an input unit 112, an output unit 113, a memory unit 114, a storage unit 115, and a communication unit 116. System 100 may optionally include other suitable hardware components and/or software components.

Processor 111 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 111 executes instructions, for example, of an Operating System (OS) 117 of system 100 or of one or more applications 118.

Input unit 112 includes, for example, a keyboard, a keypad, a mouse, a touch-pad, a track-ball, a stylus, a microphone, or other suitable pointing device or input device. Output unit 113 includes, for example, a monitor, a screen, a Cathode Ray Tube (CRT) display unit, a Liquid Crystal Display (LCD) display unit, a Light emitting Diode (LED) display unit, an Organic LED (OLED) display unit, a plasma display unit, one or more audio speakers or earphones, or other suitable output devices.

Memory unit 114 includes, for example, a Random Access Memory (RAM), a Read Only Memory (ROM), a Dynamic RAM (DRAM), a Synchronous DRAM (SD-RAM), a Fast Page Mode DRAM (FPM DRAM), an Enhanced DRAM (EDRAM), an Extended Data Output DRAM (EDO DRAM), a flash memory, a volatile memory, a non-volatile memory, a cache memory, a buffer, a short term memory unit, a long term memory unit, or other suitable memory units. Storage unit 115 includes, for example, a hard disk drive, a floppy disk drive, a Compact Disk (CD) drive, a CD-ROM drive, a Digital Versatile Disk (DVD) drive, or other suitable Removable or non-Removable storage units. Memory unit 114 and/or storage unit 115, for example, store data processed by system 100.

Communication unit 116 includes, for example, a wired or wireless Network Interface Card (NIC), a wired or wireless modem, a wired or wireless receiver and/or transmitter, a wired or wireless transmitter-receiver and/or transceiver, a Radio Frequency (RF) transceiver or communication unit, or other units able to transmit and/or receive signals, blocks, frames, transmission streams, packets, messages and/or data. Communication unit 116 optionally includes, or is optionally related with, one or more antennas, for example, a dipole antenna, a monopole antenna, an omni-directional antenna, an end fed antenna, a circularly polarized antenna, a micro-strip antenna, a diversity antenna, or the like.

In some embodiments, components of system 100 may be enclosed in a common housing or packaging, and may be interconnected or operably related using one or more wired or wireless links. In other embodiments, components of system 100 may be distributed among multiple or separate devices or locations, may be implemented using a client/server configuration or system, or may communicate using Remote access methods.

In some embodiments, when an application is launched, the OS 117 allocates logical memory pages (e.g., pages 121, 122, 123, and/or 124), to the application. A Memory Management Unit (MMU) 119 allocates to the application physical memory areas or portions included in memory unit 114. The allocation is performed, by allocating physical memory areas to logical memory pages. Logical memory pages may have a pre-defined size.

In some embodiments, memory unit 114 may include multiple Dual In-line Memory Modules (DIMMs), for example, two DIMMs 181 and 182.

DIMM 181 may include multiple DRAM devices, for example, four DRAM devices 131-134. Similarly, DIMM 182 may include multiple DRAM devices.

In some embodiments, a portion of a DRAM device may have a state selected from multiple operational states, for example, four possible operational states. A portion may be in an "on" state, namely, in a state in which the portion receives full power supply and is accessible for reading data therefrom and writing data thereon. Alternatively, a portion may be in a "self-refresh" (SR) state, namely, the portion is in an inaccessible state for reading and writing, yet power to the portion is self-refreshed, thereby the context of the portion is retained. Alternatively, a portion may be in a "leak" state, namely, the portion receives power, but is not self-refreshed, thereby the power eventually "leaks" and the context of the portion is lost. Alternatively, a portion may be in an "off" state, namely, the portion does not dissipate any power supply and does not have context.

In some embodiments, DRAM device 131 may include multiple banks, for example, eight banks 141-148. Similarly, each one of DRAM devices 132-134 may include multiple banks. In some embodiments, banks 141-148, may be vertically divided into sub-banks. For example, bank 141 may be vertically divided, to include multiple sub-banks, for example, approximately $2^6$ sub-banks, approximately $2^7$ sub-banks, approximately $2^9$ sub-banks, or the like. For demonstrative purposes, four sub-banks, namely, sub-banks 151-154 are shown. Each of banks 142-148 may be similarly vertically divided to include multiple sub-banks.

A physical memory area, for example, allocated to a memory page, may be spread or interleaved, to include different or multiple banks of different or multiple DRAM devices of a DIMM or even across multiple DIMMs. If the banks, (e.g. banks 141-148) are vertically divided into sub-banks, (e.g. sub-banks including 151-154), a physical memory area may be interleaved between multiple sub-banks and may include, for example, one sub-bank from each bank from each DRAM device (e.g. DRAM devices 131-134), included in a DIMM (e.g. DIMM 181). For example, DIMM 181 includes four DRAM devices, whereas each one of the DRAM devices includes eight banks, and every bank may be divided to include multiple sub-banks. Therefore, a physical memory area may include, for example, 32 sub-banks; based on the multiplication of one sub-bank per bank, by eight banks per DRAM device, by four DRAM devices per DIMM.

In some embodiments, for example, the vertical division of banks into sub-banks, may yield physical memory areas that have a logical page size. For example, if the size of a logical memory page is four megabytes (namely, $2^{22}$ bytes), then a bank may be divided into 32 sub-banks, each sub-bank having a size of 131,072 bytes (namely, $2^{17}$ bytes or 128 kilobytes).

OS 117 may include a page manager 125, including a page table 127. MMU 119 may translate logical page addresses (linear addresses) referred to by the page manager 125 to physical addresses in the DRAM. When an application is launched, MMU 119 may determine that a physical memory area is available, in order to perform an allocation thereof to logical memory pages. MMU 119 may receive data from page table 127 and thereby determine how logical memory pages (e.g., pages 121-124) will translate or map to different physical memory areas (e.g., physical memory areas including sub-banks 151-154), for example, using pointers, shortcuts, lookup tables, or the like.

Accordingly, MMU 119 may determine which physical sub-banks in the DRAM devices have context (i.e. hold valid logical pages). MMU 119 may initiate power self-refresh in active sub-banks, and avoid power self-refresh from sub-banks that do not have context, that are therefore allowed to leak and dissipate lower power, resulting in power saving.

In some embodiments, when system 100 is booted, the DRAM devices have no context, and no sub-bank is self-refreshed. Additionally, bits of the sub-banks are set to be all zeros or all ones. This may allow, for example, the MMU 119 to selectively self-refresh physical memory areas, corresponding to logical memory pages of the launched application, whereas physical memory areas with no context are not refreshed, as described herein.

Some embodiments utilize power management of primary (DRAM) memory through controlling the context of memory as the OS 117 allocates and de-allocates memory (e.g., memory pages). This may include an on-die DRAM topology that breaks "banks" of DRAMs into "sub-bank" structures, and groups sub-banks so that each sub-bank group exactly maps to one logical OS page (for example, four kilobyte page size, two megabyte page size, or four megabyte page size), allowing to selectively control and/or disable the sub-bank groups which correspond to individual logical pages (e.g., by avoiding refreshing sub-banks such that they lose context). This allows the DRAM to save context or destroy context in the DRAM memory cells on an OS memory page basis.

For example, once the computer is "booted" or turned on, all the memory is of the type in which the DRAM has no context, and all the sub-banks are disabled (namely, not refreshed, and they discharge to a leakage power level). As the OS 117 allocates memory (optionally using hooks of the processor 111 and/or the OS 117), the OS 117 sends appropriate commands to the MMU 119 to indicate that memory is allocated and that a number of memory sub-bank groups must be activated or enabled and initialized; optionally, each initialized sub-block of memory is set to store zero values, or one values. As the OS 117 adds or further launches applications, additional sub-banks are activated and enabled.

In contrast, as memory is de-allocated (e.g., due to an application being closed), memory is de-allocated and OS 117 sends to the MMU a de-allocation command to stop the corresponding sub-bank groups of memory from being refreshed (e.g., the sub-banks go into a low power, no context state). Accordingly, since the leakage power of the memory sub-blocks is smaller than their self-refresh power, power dissipation is optimized in accordance with the system's operation.

In some embodiments, processor 111 extensions to the MMU 119 may support the automatic allocation and de-allocation of memory, for example, by extending the page tables 127 to include a set of memory bits which indicate whether or not the memory has context. Processor 111 (or MMU 119) may perform allocation or de-allocation of memory associated with a physical memory that corresponds to an OS memory page; and the MMU 119 issues the relevant command to the DRAM 131 which then allocates or de-allocates the sub-bank(s) within the DRAM chip(s). The OS 117 may utilize these extensions to dynamically power manage the memory as the OS 117 allocates and de-allocates memory.

The DRAM topology may allow the memory allocation and de-allocation described herein. For example, DRAM 131 may be a one Gigabit DRAM having eight 16-megabyte banks 141-148 and a 16-bit data bus. The DIMM 121 may include four DRAM chips 131-134 (e.g., similar to DRAM 131), thereby creating a 64-bit data bus. For example, each one of eight 16-megabyte banks 141-148 has a row address latch, and a column address bus is represented by a vertical bus. The DRAM chips 131-134 may support Partial Array Self-Refresh (PASR), which allows a DRAM bank to not enter (or to avoid) self-refresh; hence when the entire DRAM chip enters self-refresh, selective banks may not be refreshed, may lose their context, and may thus consume less power.

In some embodiments, a DRAM sub-page "cuts" vertically across the DRAM. For example, each bank is divided into sub-banks (e.g., numbered 0 to n). The sum of one sub-bank from each bank from each DRAM device in a DIMM equals to the OS page size. For example, the size of the DRAM sub-bank structure may be set such that the DIMM sub-page sizes match the OS page sizes of the OS 117 and/or processor 111 (for example, four kilobyte page size, two megabyte page size, or four megabyte page size).

In some embodiments, optionally, one or more Memory Context Indicators (MCIs) (for example, a bit, a flag, a Boolean variable, a parameter, or the like) may be used, for example, by MMU 119, by page table 127, by page manager 125, and/or by OS 117. The value of an MCI (e.g., "1" or "0") may indicate whether or not a corresponding set of sub-banks has context. The MCI values may be modified (e.g., set or reset or toggled) upon allocation or de-allocation of corresponding sets of sub-banks. The MMU 119 may instruct the DRAM device to selectively self-refresh power supply, or to selectively avoid self-refreshing of power supply, of corresponding sets of sub-banks, based on the values of the MCIs.

Figure 2:
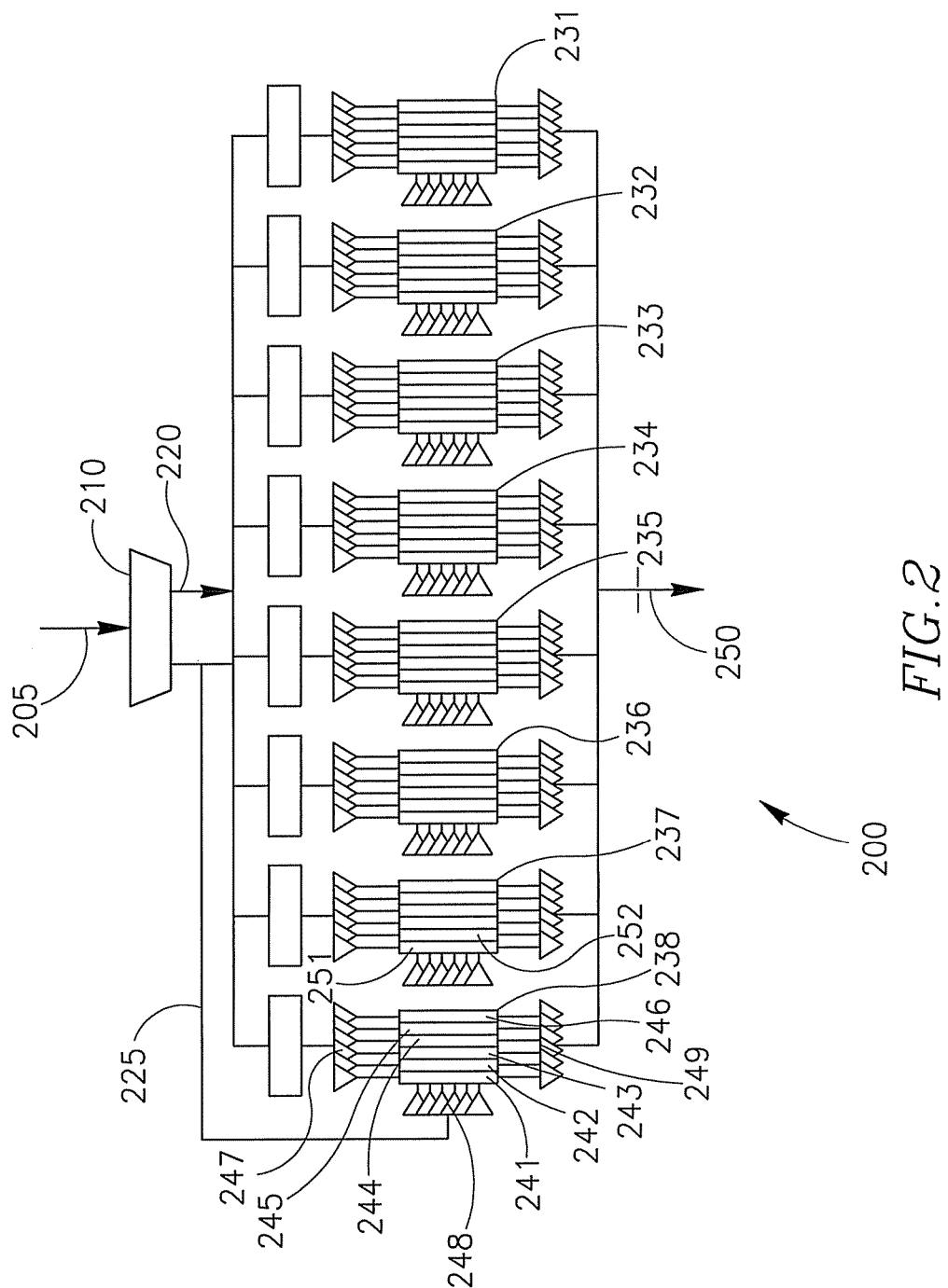
FIG. 2 is a schematic block diagram illustration of a DRAM component in accordance with a demonstrative embodiment of the invention.

FIG. 2 schematically illustrates a block diagram of a DRAM 200 having banks divided into sub-banks, in accordance with some demonstrative embodiments of the invention. A buffer is used for each row address to the sub-bank. Each bank is 16 megabytes; sub-banks have a size which depends on the OS page size. For example, 131,072 sub-banks of 128 bytes may be used with a four kilobyte OS page size; 256 sub-banks of 64 kilobytes may be used with a two megabytes OS page size; and 128 sub-banks of 128 kilobytes may be used with a four megabyte OS page size.

A set of sub-banks scattered across multiple banks or DIMM chips is tied together or otherwise associated, for example, for memory interleaving purposes. When de-allocating a sub-bank, the access to all of those associated sub-banks (across all banks and all the DRAM chips in that memory rank) is then disabled; this may be reflected by tri-stating the row address to the sub-bank, which prevent access to the related sub-banks which then discharge to leakage state. A register structure may be utilized on the DRAM chip or in conjunction therewith, the structure having a bit (or other flag or indicator) to control each of the sub-banks (namely, to selectively turn them on or off). The number of indicator bits or flags may correspond to the division into sub-banks; for example, one indicator bit may be used per each set of 32 sub-banks (which are scattered across eight banks and four DRAM chips). Accordingly, an access to a particular sub-bank (or to a set of 32 associated sub-banks) may correspond to the OS page size (for example, 128 kilobytes per sub-bank, multiplied by eight banks, multiplied by four DRAM chips, equals to a four megabyte OS page size). Hence the DRAM sub-bank size allows the context of memory to be saved or restored in accordance with OS page sizes. This technique allows to dynamically power-down memory structures when memory context is no longer relevant or required. This further allows the DRAM structures to discharge context, so that the DRAM structures drop down to a leakage power level, instead of utilizing a self-refresh power for the entire set of interleaved DRAM banks. By combining the DRAM structure with OS allocation and de-allocation of memory, only the memory being used (namely, having valid context) may consume power. This may save dynamic power consumption in working state (e.g., when the memory is operational); and may save "sleep mode" power since only the pages of memory having valid context are kept "alive" or active during self-refresh.

The DRAM device 200 includes multiple banks, for example, eight banks 231-238. Each one of banks 231-238 is divided into a plurality of sub-banks; for demonstrative purposes, six sub-banks 241-246 of bank 238 are shown (out of a possibly greater, or significantly greater, number of sub-banks of bank 238).

The division of banks into sub-banks allows defining an interleaved set of sub-banks scattered across multiple banks, the set of sub-banks associated with a common row address. For example, sub-bank 241 of bank 238 and a sub-bank 251 of bank 237 are associated with a first address row; whereas sub-bank 242 of bank 238 and a sub-bank 252 of bank 237 are associated with a second address row.

A multiplexer 210 may facilitate reading and writing to the DRAM device 200. An address bus 205 carries the address of a data location in DRAM device 200. The DRAM device address may be divided to, or may correspond to, a row address 220 and a column address 225. A row buffer, for example, row buffer 247, may buffer the row address of a particular sub-bank, e.g., a row address including sub-bank 241 of bank 238. Similarly, a column buffer, for example, column buffer 248 may buffer the column address of a particular sub-bank, e.g., to column addresses of bank 238. An output data buffer, for example, output data buffer 249, may buffer output data received from a particular bank, e.g., bank 238. Data from substantially all the banks in the DRAM device 200 may be transferred through a common data bus 250.

Figure 3:
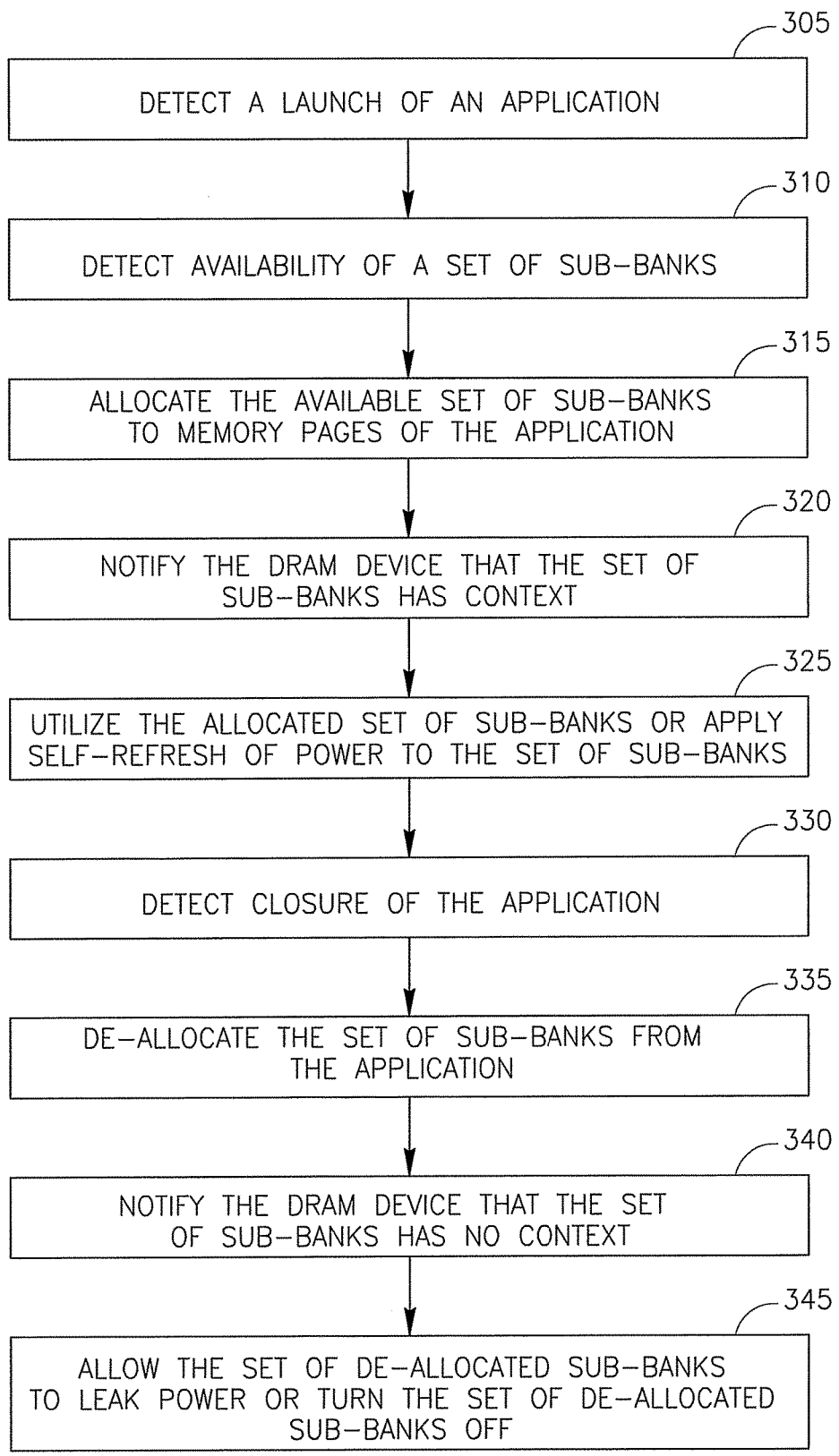
FIG. 3 is a schematic flow-chart of a method of memory allocation, in accordance with a demonstrative embodiment of the invention.

FIG. 3 is a schematic flow-chart of a method of memory allocation, in accordance with some demonstrative embodiments of the invention. Operations of the method may be used, for example, by system 100 of FIG. 1, and/or by other suitable units, devices and/or systems.

In some embodiments, the method may include, for example, detecting a launch of an application (block 305). The launch may be performed by a user or by another application or the operating system, and the detecting may be performed, for example, by MMU 119 of FIG. 1.

In some embodiments, the method may include, for example, detecting availability of a portion of a physical memory area, for example, a set of interleaved sub-banks (block 310). The portion of the physical memory area may correspond to one or more logical memory pages, for example, OS memory pages corresponding to the launched application.

In some embodiments, the method may include, for example, allocating the set of available sub-banks to the launched application (block 315). For example, a set of sub-banks including sub-bank 151 of FIG. 1 may be allocated to memory page 121 of FIG. 1. A size of the allocated physical memory may be, for example, a size of a logical memory page size.

In some embodiments, the method may include, for example, notifying a DRAM device that the set of sub-banks has context (block 320). The notification may be performed, for example, by OS 117 of FIG. 1, or by MMU 119 of FIG. 1.

In some embodiments, the method may include, for example, utilizing the allocated set of sub-banks (e.g., if the set of sub-banks is in "on" state), or initiating self-refreshing of power to the allocated set of sub-banks (e.g., if the set of sub-banks is in "self-refresh" state or is idle) (block 325). This may be performed, for example, by the DRAM device.

In some embodiments, the method may include, for example, detecting a closure or termination of the application (block 330). The closure may be performed by a user or by another application or by the operating system.

In some embodiments, the method may include, for example, de-allocating the physical memory portion from the application that was closed or terminated (block 335). For example, a set of sub-banks including sub-bank 152 of FIG. 1 may be de-allocated from memory page 122 of FIG. 1.

In some embodiments, the method may include, for example, notifying the DRAM device that the set of sub-banks does not have context (block 340). The notifying may be performed, for example, by OS 117 of FIG. 1, or by MMU 119 of FIG. 1.

In some embodiments, the method may include, for example, allowing the set of de-allocated sub-banks to leak power (e.g., if the set of sub-banks is in "leak" state), or turning off the set of de-allocated sub-banks (e.g., if the set of sub-banks is in "off" state) (block 345). This may be performed, for example, by the DRAM device, after receiving the notification about the memory de-allocation.

Other suitable operations or sets of operations may be used in accordance with embodiments of the invention.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid state memory, magnetic tape, a removable computer diskette, a random access memory (RAM), a read-only memory (ROM), a rigid magnetic disk, and an optical disk. Some demonstrative examples of optical disks include compact disk-read only memory (CD-ROM), compact disk-read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes.

What is claimed is:

1. A non-transitory machine-readable medium storing instructions, the instructions, when read by a machine to cause the machine to:
   allocate, in a page table in response to operation by an operating system, a first portion of a dynamic random access memory (DRAM) bank to refresh at a first refresh rate to maintain a context of data stored in the first portion of the DRAM bank, wherein the first portion includes at least an amount of data equal to a page in the operating system; and
   allocate, in the page table in response to operation by the operating system, a second portion of the same DRAM bank to not refresh at the first refresh rate, the second portion of the DRAM bank to at least maintain a context of data stored in the second portion for less time than the first portion, wherein the second portion includes at least an amount of data equal to a page in the operating system.

2. The medium of claim 1, wherein a circuitry comprising a memory location in the allocated first portion of the DRAM bank consumes a greater amount of power, at least during a refresh cycle, than a circuitry comprising a memory location in the allocated second portion of the DRAM bank.

3. The medium of claim 1, wherein at least a portion of the second portion of the DRAM bank to be allocated at a first time.

4. The medium of claim 3, wherein the at least portion of the second portion of the DRAM bank to not refresh after the first time.

5. The medium of claim 1, wherein the second portion of the DRAM bank to change an allocation size during operation of the DRAM bank.

6. An apparatus, comprising:
   a dynamic random access memory (DRAM) bank comprising:
   a first portion of the DRAM bank allocated in a page table in response to operation by an operating system to refresh at a first refresh rate to maintain a context of data stored in the first portion, wherein the first portion includes at least an amount of data equal to a page in the operating system; and
   a second portion of the DRAM bank allocated in the page table in response to operation by the operating system to not refresh at the first refresh rate, the second portion of the DRAM bank to at least maintain a context of data stored in the second portion for less time than the first portion, wherein the second portion includes at least an amount of data equal to a page in the operating system.

7. The apparatus of claim 6, wherein a circuitry comprising a memory location in the allocated first portion of the DRAM bank consumes a greater amount of power, at least during a refresh cycle, than a circuitry comprising a memory location in the allocated second portion of the DRAM bank.

8. The apparatus of claim 6, wherein at least a portion of the second portion of the DRAM bank to be allocated at a first time.

9. The apparatus of claim 8, wherein the at least portion of the second portion of the DRAM bank to not refresh after the first time.

10. The apparatus of claim 6, wherein the second portion of the DRAM bank to change an allocation size during operation of the DRAM bank.

11. An apparatus, comprising:
    logic, at least partially implemented in hardware, to:
    allocate, in a page table in response to operation by an operating system, a first portion of a dynamic random access memory (DRAM) bank to refresh at a first refresh rate to maintain a context of data stored in the first portion, wherein the first portion includes at least an amount of data equal to a page in the operating system; and
    allocate, in the page table in response to operation by the operating system, a second portion of the same DRAM bank to not refresh at the first refresh rate, the second portion of the DRAM bank to at least maintain a context of data stored in the second portion for less time than the first portion, wherein the second portion includes at least an amount of data equal to a page in the operating system.

12. The apparatus of claim 11, wherein a circuitry comprising a memory location in the allocated first portion of the DRAM bank consumes a greater amount of power, at least during a refresh cycle, than a circuitry comprising a memory location in the allocated second portion of the DRAM bank.

13. The apparatus of claim 11, wherein at least a portion of the second portion of the DRAM bank to be allocated at a first time.

14. The apparatus of claim 13, wherein the at least portion of the second portion of the DRAM bank to not refresh after the first time.

15. The apparatus of claim 11, wherein the second portion of the DRAM bank to change an allocation size during operation of the DRAM bank.

16. A system, comprising:
    a dynamic random access memory (DRAM) module including at least one bank; and logic, at least partially implemented in hardware, to:
allocate, in a page table in response to operation by an operating system, a first portion of a dynamic random access memory (DRAM) bank to refresh at a first refresh rate to maintain a context of data stored in the first portion, wherein the first portion includes at least an amount of data equal to a page in the operating system; and
allocate, in the page table in response to operation by the operating system, a second portion of the same DRAM bank to not refresh at the first refresh rate, the second portion of the DRAM bank to at least maintain a context of data stored in the second portion for less time than the first portion, wherein the second portion includes at least an amount of data equal to a page in the operating system.

17. The system of claim 16, wherein a circuitry comprising a memory location in the allocated first portion of the DRAM bank consumes a greater amount of power, at least during a refresh cycle, than a circuitry comprising a memory location in the allocated second portion of the DRAM bank.

18. The system of claim 16, wherein at least a portion of the second portion of the DRAM bank to be allocated at a first time.

19. The system of claim 18, wherein the at least portion of the second portion of the DRAM bank to not refresh after the first time.

20. The system of claim 16, wherein the second portion of the DRAM bank to change an allocation size during operation of the DRAM bank.

\* \* \* \* \*